United States Patent
Lee (10) Patent No.: US 8,140,783 B2
(45) Date of Patent: Mar. 20, 2012

(54) MEMORY SYSTEM FOR SELECTIVELY TRANSMITTING COMMAND AND ADDRESS SIGNALS

(75) Inventor: Dong-yang Lee, Kyungki-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 12/683,005

(22) Filed: Jan. 6, 2010

(65) Prior Publication Data

US 2010/0165782 A1 Jul. 1, 2010

Related U.S. Application Data

(63) Continuation of application No. 11/589,765, filed on Oct. 31, 2006, now Pat. No. 7,707,355, which is a continuation-in-part of application No. 10/422,792, filed on Apr. 25, 2003, now Pat. No. 7,366,827.

(30) Foreign Application Priority Data

Apr. 27, 2002 (KR) .............................. 2002-0023272

(51) Int. Cl.
*G06F 12/02* (2006.01)
(52) U.S. Cl. ................ 711/158; 711/4; 711/5; 711/100; 711/111; 711/112; 711/154; 365/189.05; 365/230.08
(58) Field of Classification Search .................. 711/4–5, 711/100, 111–112, 154, 158; 365/189.05, 365/230.08
See application file for complete search history.

(56) References Cited

U.S. PATENT DOCUMENTS

| | | | |
|---|---|---|---|
| 5,946,260 A * | 8/1999 | Manning | 365/230.03 |
| 6,021,477 A | 2/2000 | Mann | |
| 6,215,727 B1 | 4/2001 | Parson et al. | |
| 6,502,161 B1 | 12/2002 | Perego et al. | |
| 6,530,006 B1 | 3/2003 | Dodd et al. | |
| 6,862,653 B1 * | 3/2005 | Dodd et al. | 711/105 |
| 7,003,684 B2 | 2/2006 | Chang | |
| 7,366,827 B2 | 4/2008 | Lee | |
| 2002/0026600 A1 | 2/2002 | Jung et al. | |
| 2003/0126338 A1 | 7/2003 | Dodd et al. | |
| 2003/0200407 A1 | 10/2003 | Osaka et al. | |
| 2007/0043922 A1 | 2/2007 | Lee | |

* cited by examiner

*Primary Examiner* — Jasmine Song
(74) *Attorney, Agent, or Firm* — Muir Patent Consulting, PLLC (57) ABSTRACT

A system includes a memory controller adapted to output address signals, command signals and select signals; a plurality of memory modules; and a plurality of buses each corresponding to one of the memory modules. Each bus is adapted to transmit corresponding ones of the address signals, the command signals, and the select signals to the corresponding memory module. Each of the memory modules includes: a plurality of memory devices; and a register adapted to receive and buffer the corresponding command and address signals transmitted to the memory module, and adapted to transmit the buffered command signal to the memory devices which are to be accessed, in response to the corresponding select signal for accessing the memory devices.

27 Claims, 5 Drawing Sheets

MEMORY SYSTEM FOR SELECTIVELY TRANSMITTING COMMAND AND ADDRESS SIGNALS

CROSS REFERENCES TO RELATED APPLICATIONS

This application is a continuation of U.S. patent application Ser. No. 11/589,765 filed on Oct. 31, 2006, now U.S. Pat. No. 7,707,355 the entirety of which is incorporated by reference herein for all purposes as if fully set forth herein, which is a continuation-in-part of U.S. patent application Ser. No. 10/422,792 filed on 25 Apr. 2003, now U.S. Pat. No. 7,366,827, the entirety of which is incorporated by reference herein for all purposes as if fully set forth herein, and claims priority under 35 U.S.C. §119 from Korean Patent Application No. 2002-0023272, filed on Apr. 27, 2002, the contents of which are hereby incorporated by reference in their entirety as if fully set forth herein.

BACKGROUND AND SUMMARY

1. Technical Field

The present invention relates to an apparatus for transmitting signals, and more particularly, to a memory system for selectively transmitting command and address signals. Furthermore, the present invention relates to a register for buffering a command signal and an address signal in a memory module accessed by a memory controller, a memory module including a register, and a system thereof.

2. Description

Figure 1:
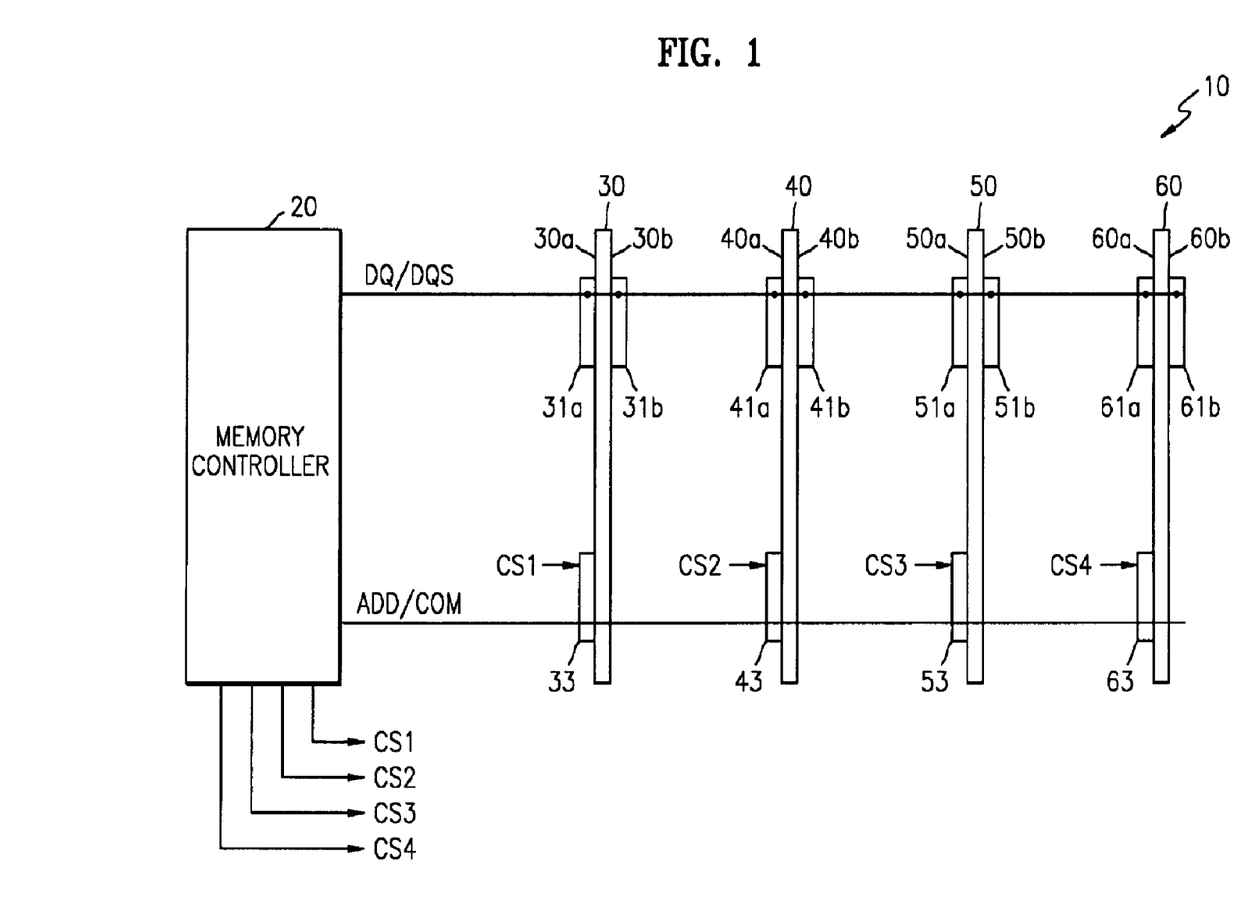
FIG. 1 is a block diagram of a memory system.

FIG. 1 is a block diagram of a system for transmitting signals. Referring to FIG. 1, a system 10 includes a memory controller 20 and a plurality of memory modules 30, 40, 50, and 60.

The memory modules 30, 40, 50, and 60 are realized as dual in-line memory modules (DIMMs), and are inserted into corresponding slots (not shown) of the system.

The memory controller 20 outputs a command signal COM including a row address strobe (RAS), a column address strobe (CAS), a write enable signal (WE), a plurality of select signals CS1, CS2, CS3, and CS4, and an address signal ADD to the plurality of DIMMs 30, 40, 50, and 60 via a predetermined bus. Here, each of the select signals CS1, CS2, CS3 and CS4 is a signal for accessing ranks or memory modules. The rank denotes a selected group of a plurality of semiconductor devices mounted on a memory module in response to one of the select signals CS1, CS2, CS3 and CS4.

The DIMM 30 may be formed of one or more ranks according to the type of the DIMM 30. On the other hand, the DIMM 30 includes DRAMs and a register, regardless of the number of the ranks.

Figure 2:
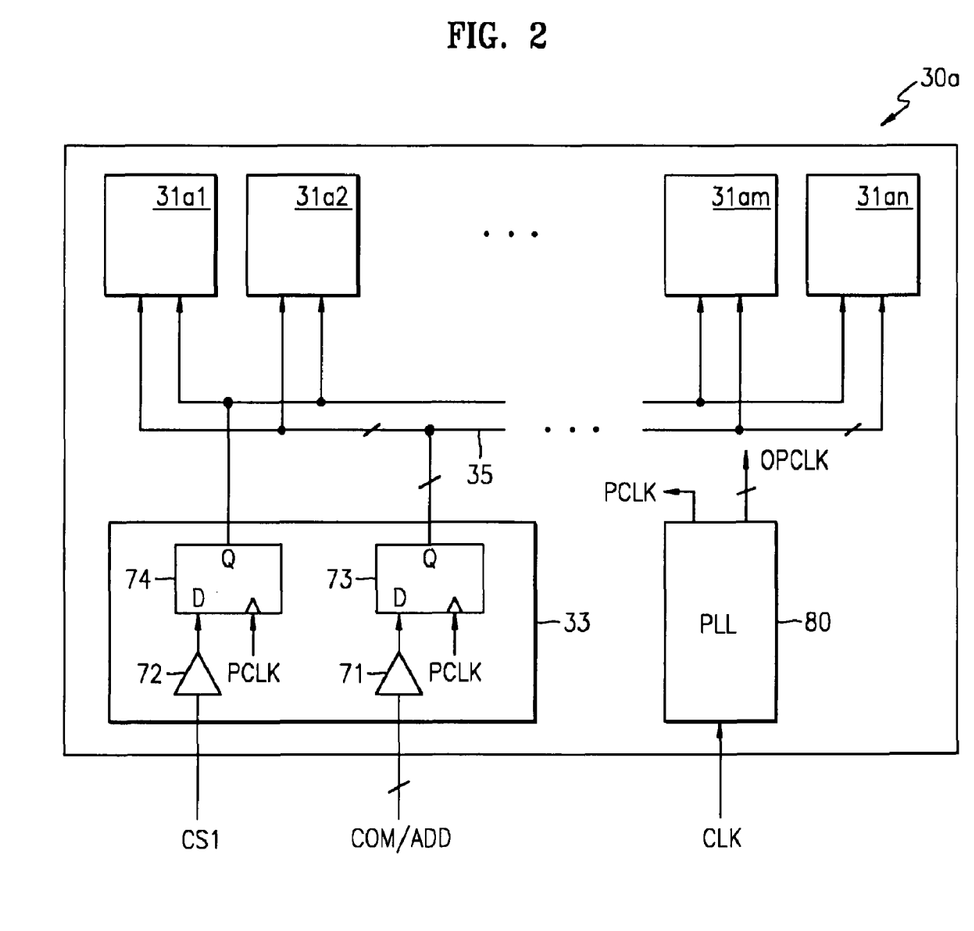
FIG. 2 illustrates a DIMM including a register.

FIG. 2 illustrates a DIMM including a conventional register. Referring to FIGS. 1 and 2, the DIMM 30 includes memory devices as DRAMs 31a1, 31a2, ..., 31am, and 31an, a register 33, and a phase locked loop (PLL) 80.

Since the circuitry 30b on a rear surface of the DIMM 30 may be different from the circuitry 30a on a front surface of the DIMM 30 according to the kind of the DIMM 30, only the circuitry 30a on the front surface of the DIMM 30 is illustrated for convenience in description.

The arrangements of the DIMMs 40, 50, and 60 are the same as the arrangement of the DIMM 30, which can be conveniently understood from the arrangement of the DIMM 30.

The PLL 80 generates a plurality of clock signals PCLK and OPCLK whose phases are locked to the phase of a clock signal CLK. Here, one clock signal PCLK of the clock signals PCLK and OPCLK is input to a first latch 73 and a second latch 74 of the register 33a.

The other clock signals OPCLK are used for a predetermined memory device.

A command signal COM, a plurality of select signals CS1, CS2, CS3, and CS4 and an address signal ADD output from the memory controller 20 are transmitted via a predetermined bus to each register 33, 43, 53, and 63 of each of the DIMMs 30, 40, 50, and 60.

Here, each register 33, 43, 53, and 63 in the DIMMs 30, 40, 50, and 60 has a buffer 71, a second buffer 72, a first latch 73, and a second latch 74 respectively.

The first buffer 71 receives the command signal COM and the address signal ADD and buffers the signals, and the second buffer 72 receives and buffers the select signal CS1.

The first latch 73 transmits the buffered command signal and address signal to memory devices 31a1, 31a2, ..., 31am, and 31an in the DIMMs 30, 40, 50, and 60, in response to the clock signal PCLK and the second latch 74 transmits the buffered select signal to the memory devices 31a1, 31a2, ..., 31am, and 31an in the DIMMs 30, 40, 50, and 60, in response to the clock signal PCLK. The memory devices 31a1, 31a2, ..., 31am, and 31 in the DIMMs 30 are selected in response to the select signal CS1.

Referring to FIGS. 1 and 2, although the system 10 including four DIMMs 30, 40, 50, and 60, intends to access a first rank 61a of the DIMM 60, the command signal COM and the address signal ADD output from the memory controller 20 are transmitted to each DIMM 30, 40, 50, and 60 via the predetermined bus. Therefore, the predetermined bus connected between the register 33 and the memory devices 31a1, 31a2, ..., 31am, and 31an in the DIMMs 30, 40, and 50 consumes electric power in response to toggling the command signal COM and the address signal ADD.

Accordingly, the registers 33, 43, and 53 corresponding to the DIMMs 30, 40, and 50, respectively, which do not need to be accessed, are activated so that each latch 73 transmits the buffered command signal and the address signal to the DRAMs of each DIMM 30, 40, and 50, via the predetermined bus 35 in response to the clock signal PCLK.

Consequently, the predetermined buses connected between the memory devices and the registers 33, 43, and 53 in the corresponding DIMMs 30, 40, and 50 respond to the toggling command signal and address signal, thereby consuming electric power.

Since the registers mounted on the memory modules which are not accessed also output to their output terminals the toggling command signal and address signal received at their input terminals, the toggling command signal and address signal are transmitted to bus provided on the memory modules. As a result, the system consumes a large amount of electric power.

To solve the above-described problem, it would be desirable to provide a method and an apparatus for transmitting command signal and address signals selectively to reduce electric power consumption.

Accordingly, in one aspect of the invention, a system as disclosed herein includes: a memory controller adapted to output address signals, command signals and select signals; a plurality of memory modules; and a plurality of buses each corresponding to one of the memory modules. Each bus is adapted to transmit corresponding ones of the address signals, the command signals, and the select signals to the corresponding memory module. Each of the memory modules includes: a plurality of memory devices; and a register adapted to receive and buffer the corresponding command and address signals transmitted to the memory module, and adapted to transmit the buffered command signal to the memory devices which are to be accessed, in response to the corresponding select signal for accessing the memory devices.

In another aspect of the invention, a system as disclosed herein

BRIEF DESCRIPTION OF THE DRAWINGS

The above objective and advantages of the present invention will become more apparent by describing in detail a preferred embodiment thereof with reference to the attached drawings in which.

DETAILED DESCRIPTION

The present invention will now be described more fully with reference to the accompanying drawings, in which a preferred embodiment of the invention is shown. The same reference numerals in different drawings represent the same elements.

Figure 3:
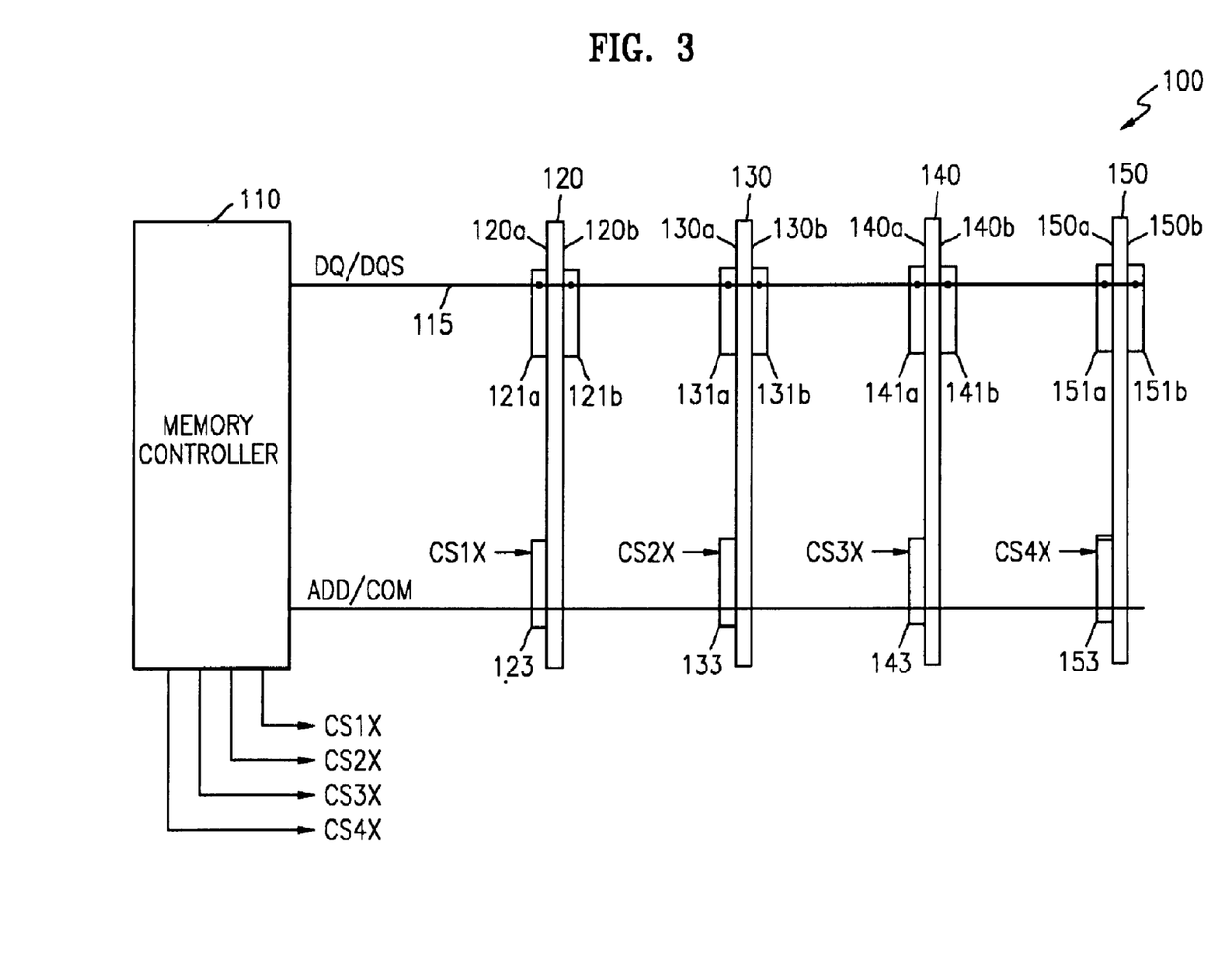
FIG. 3 is a block diagram of a memory system including a register according to one embodiment.

FIG. 3 is a block diagram of a system including a register according to one embodiment. The system 100 shown in FIG. 3 is the same as the system 10 shown in FIG. 1, except for registers 123, 133, 143, and 153.

In other words, a memory controller 110 outputs a command signal COM, an address signal ADD, and a plurality of select signals CS1$x$, CS2$x$, CS3X, and CS4X via a predetermined bus to memory modules (DIMMs) 120, 130, 140, and 150 which are inserted into corresponding slots.

Ranks 121$a$, 121$b$, 131$a$, 131$b$, 141$a$, 141$b$, 151$a$, and 151$b$ installed in respective memory modules 120, 130, 140, and 150, and the memory controller 110 exchange predetermined data DQ in response to a data strobe signal DQS.

Figure 4:
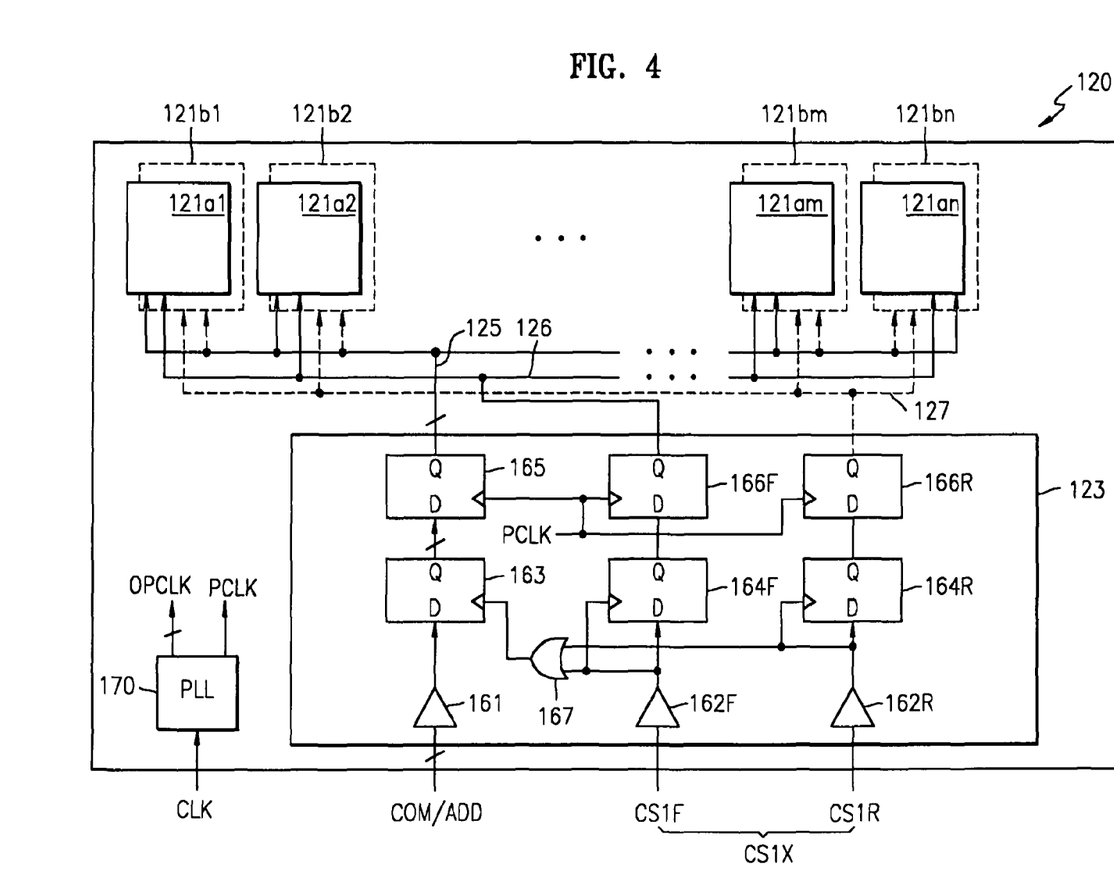
FIG. 4 illustrates a DIMM including a register according to one embodiment.

FIG. 4 is a block diagram of a DIMM including a register according to one embodiment. Referring to FIGS. 3 and 4, a front surface 120$a$ of the DIMM 120 includes a phase locked loop (PLL) 170, a register 123, and a plurality of memory devices 121$a$1, 121$a$2, ..., 121$am$, and 121$an$. Also, a back surface 120$b$ of the DIMM 120 includes a plurality of memory devices 121$b$1, 121$b$2, ..., 121$bm$, and 121$bn$. The select signal CS1F selects a first rank 121$a$ including the plurality of memory devices 121$a$1, 121$a$2, ..., 121$am$ and 121$an$, and the select signal CS1R selects a second rank 121$b$ including the plurality of memory devices 121$b$1, 121$b$2, ..., 121$bm$ and 121$bn$.

The constitution and operation of each register 133, 143, and 153 are similar to the constitution and operation of the register 123 shown in FIG. 4.

The PLL 170 generates a plurality of clock signals PCLK and OPCLK whose phases are synchronized with the phase of a clock signal CLK, and one clock signal PCLK is input to each of the latches 165, 166F, and 166R of the register 123.

The other clock signals OPCLK, of the clock signals PCLK and OPCLK, are used for a predetermined memory device.

The register 123 includes a first buffer 161, a second buffer 162F, a third buffer 162R, a plurality of latches 163, 164F, 164R, 165, 166F and 166R, and OR gate 167. The first buffer 161 receives and buffers the command signal COM and the address signal ADD output from the memory controller 110, and outputs the buffered command signal and the address signal to the first latch 163. Here, the command signal COM includes a RAS, a CAS, and a WE.

The second buffer 162F receives and buffers a select signal CS1F output from the memory controller 110, and outputs the buffered select signal to an input terminal and a clock terminal of the second latch 164F and the OR gate 167.

The third buffer 162R receives and buffers a select signal CS1R output from the memory controller 110, and outputs the buffered select signal to an input terminal and a clock terminal of the third latch 164R and the OR gate 167.

The OR gate 167 receives and logically "ORs" together the signals output from the buffers 162F and 162R, and outputs the result to the clock terminal of the first latch 163.

Each of the latches 163, 164F, 164R, 165, 166F and 166R shown in the embodiment of FIG. 4 is realized with a D-flip flop; however, each of the latches 163, 164F, 164R, 165, 166F and 166R may be realized with a latch other than a D-flip flop.

The first latch 163 latches an output signal of the first buffer 161 in response to the output signal of the OR gate 167. Here, a select signal CS1X includes a select signal CS1F and a select signal CS1R. The select signal CS1X selects the first rank 121$a$ and the second rank 121$b$ to be accessed by the memory controller 110.

Therefore, the select signal CS1F selects a first rank 121$a$ including the plurality of memory devices 121$a$1, 121$a$2, ..., 121$am$, and 121$an$ to be accessed by the memory controller 110, and the select signal CS1R selects a second rank 121$b$ including the plurality of memory devices 121$b$1, 121$b$2, 121$bm$, and 121$bn$ to be accessed by the memory controller 110.

The second latch 164F latches an output signal of the second buffer 162F in response to the output signal of the second buffer 162F, and the third latch 164R latches an output signal of the third buffer 162R in response to the output signal of the third buffer 162R.

In response to the clock signal PCLK, the fourth latch 165 transmits an output signal of the first buffer 163 to the first rank and/or the second rank accessed by the select signals CS1F and/or CS1R.

In response to the clock signal PCLK, the fifth latch 166F transmits an output signal of the second buffer 164F to the first rank accessed by the select signal CS1F.

Also, in response to the clock signal PCLK, the sixth latch 166R transmits an output signal of the third buffer 164R to the second rank accessed by the select signal CS1R.

Each memory device 121$a$1, 121$a$2, ..., 121$am$, and 121$an$ has a command/address input buffer to buffer an output signal of the fourth latch 165.

Each memory device 121$a$1, 121$a$2, ..., 121$am$, and 121$an$, and each memory device 121$b$1, 121$b$2, ..., 121$bm$, and 121$bn$, can be realized as an SDRAM or a DDR SDRAM.

In this case, each of the select signals CS1X, CS2X, CS3X, and CS4X output from the memory controller 110 is a chip select signal.

The register 123 determines whether a rank or a memory module is accessed so that the register 123 is activated when the rank or the memory module is accessed.

The operation of the register 123 mounted on the DIMM 120 which is accessed will now be described in detail with reference to FIGS. 3 and 4.

A memory controller 110 outputs a command signal COM, an address signal ADD, and a plurality of select signals CS1X, CS2X, CS3X, and CS4X, via a predetermined bus to each DIMM 120, 130, 140, and 150 inserted into corresponding slots.

A first latch 163 of the register 123 mounted on a front surface 120a of the DIMM 120 transmits an output signal of the first buffer 161 to a corresponding fourth latch 165, in response to the one of the select signals CS1F and CS1R.

Accordingly, the fourth latch 165 transmits an output signal of the first latch 163 to the first rank 121a and/or the second rank 121b of the DIMM 120 via a bus 125, in response to a clock signal PCLK.

In this case, each register 133, 143, and 153 mounted on each DIMM 130, 140, and 150 is inactivated, in response to the select signal CS1X for accessing the first rank 121a and the second rank 121b mounted on DIMM 120. Also, the second rank including memory device 121b1, 121b2, ..., 121bm, and 121bn mounted on the rear surface 120b of the DIMM 120 is inactivated, in response to the select signal CS1F for accessing the first rank.

In other words, when the memory controller 110 accesses one memory module, only the registers mounted on the accessed memory module are activated.

Accordingly, the only input buffers of the memory devices and the bus 125 mounted on the accessed memory module consume electric power so that the system formed of the modules including the registers as shown in FIGS. 3 & 4 consumes a smaller amount of current than a system formed of the modules shown in FIGS. 1 & 2.

In addition, the operation of the register 123a mounted on the front surface 120a of the DIMM 120 when the first rank 121a mounted on the front surface 120a is accessed, will now be described in detail with reference to FIGS. 3 and 4.

A memory controller 110 outputs a select signal CS1F, for accessing a first rank 121a, via a predetermined bus to each register 123, 133, 143 and 153.

In this case, in response to the output signal of the second buffer 162F, a second latch 164F of the register 123 outputs to the fifth latch 166F the buffered signal of the second buffer 162F, while the third latch 164R is inactivated.

The first latch 163 of the register 123 is activated in response to the OR gate 167 for accessing the first rank 121a, while the other registers 133, 143 and 153 are inactivated.

Accordingly, the first latch 163 transmits an output signal of a buffer 161 to a fourth latch 165, in response to the select signal CS1F. Thereafter, the fourth latch 165 transmits, via a bus 125, an output signal of the first latch 163 to each memory device 121a1, 121a2, ..., 121am, and 121an, in response to a clock signal PCLK.

And the fifth latch 166F transmits, via a bus 126, an output signal of the second latch 164F to each memory device 121a1, 121a2, ..., 121am, and 121an comprising the first rank 121a, in response to a clock signal PCLK.

In other words, when the memory controller 110 accesses one rank, the register corresponding to the accessed rank is activated. Therefore, the bus 125 connected between the fourth latch 165 and the memory devices 121a1, 121a2, ..., 121am, and 121an comprising the accessed rank, consume an amount of electrical power in response to the command signal and the address signal.

In addition, the operation of the register 123, mounted on the front surface 120a of the DIMM 120, when the first rank 121a and the second rank 121b mounted on the DIMM 120 is accessed, will now be described in detail with reference to FIGS. 3 and 4.

A memory controller 110 outputs a select signal CS1X, for accessing a first rank 121a and a second rank 121b, via a predetermined bus to each register 123, 133, 143, and 153.

In this case, the second latch 164F transmits an output signal of the second buffer 162F to the fifth latch 166F in response to the output signal of the second buffer 162F, and the third latch 164R transmits an output signal of the third buffer 162R to the sixth latch 166R in response to the output signal of the third buffer 162R. Also the first latch 163 transmits an output signal of the first buffer 161 to the fourth latch 165 in response to the output signal of the OR gate 167.

The fourth latch 165 transmits, via the bus 125, the output signal of the first latch 163 to the first rank 121a and the second rank 121b in response to a clock signal PCLK; the fifth latch 166F transmits, via a bus 126, the output signal of the second latch 164F to each memory device 121a1, 121a2, ..., 121am and 121an comprising the first rank 121a in response to a clock signal PCLK; and the sixth latch 166R transmits, via a bus 127, the output signal of the third latch 164R to each memory device 121b1, 121b2, ..., 121bm, and 121bn comprising the second rank 121b in response to a clock signal PCLK.

Figure 5:
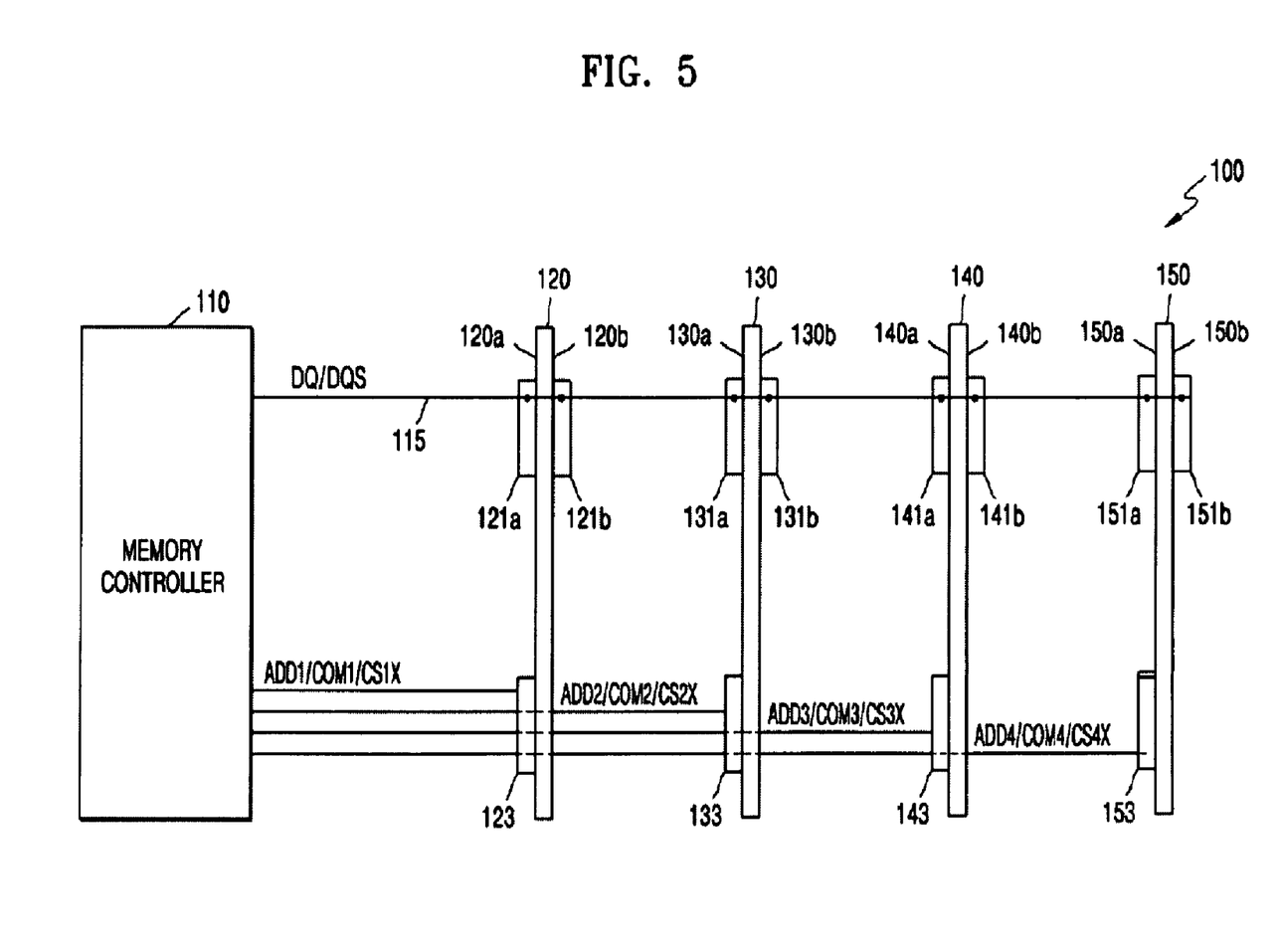
FIG. 5 is a block diagram of a memory system including a register according to another embodiment.

FIG. 5 is a block diagram of a system 500 including a register according to another embodiment. The system 500 shown in FIG. 5 is the same as the system 100 shown in FIG. 3, except for the separate busses 51x for each of the DIMMs 120, 130, 140, and 150. More specifically, the system 500 includes a first bus 5112 between memory controller 110 and DIMM 120, a second bus 512 between memory controller 110 and DIMM 130, a third bus 513 between memory controller 110 and DIMM 140, and a fourth bus 514 between memory controller 110 and DIMM 150. Each of the busses 51x communicates corresponding address signals ADDi, command signals COMi, and select signals CSiX from memory controller 110 to each corresponding DIMM 120-150, where i∈ (1, 4).

A memory module including a register as disclosed herein can selectively transmit a command signal and an address signal to memory devices comprising a rank in the memory module, thereby reducing an amount of current consumed by the bus connected between the register and the rank of a memory module that is not accessed.

A method and an apparatus for selectively transmitting a command signal and an address signal can selectively transmit a command signal and an address signal to memory devices in a memory module, thereby reducing the amount of current consumed by the memory devices of memory modules not accessed.

While this invention has been particularly shown and described with reference to preferred embodiments thereof, the preferred embodiments described above are merely illustrative and are not intended to limit the scope of the invention. It will be understood by those skilled in the art that various changes in form and details may be made therein without departing from the spirit and scope of the invention as defined by the appended claims.

What is claimed is:

1. A memory module comprising:
 a plurality of DRAM memory devices; and
 a register configured to selectively latch command information and address information in response to a chip select signal, the register having an output to transmit the command information and address information to the plurality of DRAM memory devices in response to a first clock signal,
 wherein the register is configured to selectively latch the command information and the address information only when at least one of the plurality of DRAM memory devices is selected by the chip select signal.

2. The memory module of claim 1, further comprising a clock generation circuit including a first output having the first clock signal thereon.

3. The memory module of claim 2, further comprising an external clock signal input which is supplied to the clock generation circuit, wherein the clock generation circuit generates the first clock signal in response to the external clock signal.

4. The memory module of claim 3, wherein the clock generation circuit includes a second output having a memory clock signal which is supplied to the plurality of DRAM memory devices.

5. The memory module of claim 4, further comprising:
a chip select signal input;
a select logic circuit connected to the chip select signal input to receive the chip select signal supplied externally with respect to the memory module and having an output on which a first select signal is provided,
wherein the register includes a control input connected to receive the first select signal to control latching the command information and address information.

6. The memory module of claim 5, wherein the chip select signal is used to select an access to one of the plurality of DRAM memory devices.

7. The memory module of claim 6, wherein the plurality of DRAM memory devices are responsive to a node containing information of the chip select signal with a timing provided by the first clock signal.

8. The memory module of claim 7, wherein the register further comprises a buffer connected to receive the command information and address information.

9. The memory module of claim 8, wherein the buffer comprises a first D flip-flop circuit connected to latch the command and address information in response to the first select signal and a second D flip-flop which transmits the command and address information in response to the first clock signal.

10. A memory module comprising:
a plurality of DRAM memory devices;
a latch circuit connected to receive external command information and external address information and to latch the external command information and external address information in response to a first select signal, and connected to transmit the address information and command information to the plurality of DRAM memory devices in response to a first clock signal;
a clock generation circuit having an input to provide an external clock signal and having outputs to provide the first clock signal and a memory clock signal to the plurality of DRAM memory devices; and
a select logic circuit connected to receive an external select signal supplied externally to the memory module, having an output of the first select signal generated in response to the external select signal, and having an output of a second select signal generated in response to the external select signal,
wherein the plurality of DRAM memory devices are responsive to the second select signal at a timing corresponding to the first clock signal to control access to the plurality of DRAM memory devices,
wherein the latch circuit is configured to transmit the command information and the address information only when at least one of the plurality of DRAM memory devices is selected by the first select signal.

11. A memory module comprising:
a plurality of DRAM memory devices;
a first circuit connected to receive a command signal and an address signal, the command signal and the address signal being gated by a first select signal, the first circuit being configured to selectively transmit in response to the first select signal the command signal and the address signal to the DRAM memory devices in accordance with a timing of a first clock signal;
a clock generation circuit connected to receive an external clock signal and having an output of the first clock signal and a memory clock signal; and
wherein the plurality of DRAM memory devices are connected to the memory clock signal,
wherein the first circuit is configured to transmit the command information and the address information only when at least one of the plurality of DRAM memory devices is selected by the first select signal.

12. The memory module of claim 11,
wherein the first circuit comprises a select logic circuit connected to receive an externally supplied second select signal to generate the first select signal, and
wherein the plurality of DRAM memory devices are responsive to the second select signal in determining an access of a particular one of the plurality of DRAM memory devices.

13. A method of operating a memory module comprising a plurality of DRAM devices and a register separate from the plurality of DRAM devices, the method comprising:
receiving in the register an external select signal externally supplied with respect to the memory module;
receiving in the register information externally supplied with respect to the memory module; and
transmitting the received information to the plurality of DRAM devices only when the external select signal indicates a selection of one of the DRAM devices for access, further comprising latching and failing to latch the information in accordance with the external select signal.

14. The method of claim 13, wherein the external select signal comprises a chip select signal.

15. The method of claim 13, wherein the external select signal comprises multiple chip select signals received over multiple inputs of the memory module.

16. The method of claim 15, further comprising transmitting information of the external select signal to the plurality of DRAM devices.

17. The method of claim 13, further comprising:
receiving an external clock externally with respect to the memory module; and
generating an internal clock in response to the received external clock,
wherein the transmitting of the received information comprises transmitting the received information at a timing corresponding to the internal clock.

18. The method of claim 13, wherein the information comprises at least one of command information and address information.

19. A memory module comprising:
an operating information bus;
a plurality of DRAM devices, each connected to the operating information bus to receive operating information;
register means for inputting operating information and chip select information and for selectively transmitting the operating information to the plurality of DRAM devices via the operating information bus only when the chip select information indicates a selection of one of the plurality of DRAM devices.

20. The memory module of claim 19, wherein the operating information comprises at least one of command information and address information.

21. A memory module comprising:
an information bus;
a chip select bus;
a plurality of DRAM devices, each DRAM device connected to the information bus and to the chip select bus, and each DRAM device including an information buffer to buffer information received on the information bus;
a register connected to receive external information externally supplied with respect to the memory module and connected to receive chip select information externally supplied with respect to the memory module, and connected to transmit the external information to each of the plurality of DRAM devices via the information bus in response to the chip select information, and to transmit signals containing chip select information on the chip select bus to the plurality of DRAM devices,
wherein the register is configured to transmit the external information to each of the plurality of DRAM devices only when at least one of the plurality of DRAM devices is selected by the chip select information.

22. The memory module of claim 21, wherein the register includes a circuit which gates the external information to allow transmission of the external information on the information bus only when the chip select information indicates a selection of one of the memory devices for access.

23. The memory module of claim 22, wherein the external information is at least one of command information and address information.

24. The memory module of claim 23, wherein the external information is both command information and address information.

25. The memory module of claim 24, further comprising a locked loop circuit receiving an external clock and generating a clock in response thereto, wherein the register operates to allow transmission of the external information on the information bus with a timing corresponding to the clock.

26. The memory module of claim 24, further comprising a locked loop circuit receiving an external clock and generating a clock in response thereto, the clock used by a predetermined memory device.

27. The memory module of claim 24, wherein the chip select bus comprises multiple conductor lines.

* * * * *